(12) United States Patent
Shin et al.

(10) Patent No.: US 10,416,721 B2
(45) Date of Patent: Sep. 17, 2019

(54) FOLDABLE DISPLAY DEVICE (71) Applicant: Samsung Display Co., Ltd., Yongin, Gyeonggi-do (KR)

(72) Inventors: Heon Jung Shin, Hwaseong-si (KR); Ah Young Kim, Gunpo-si (KR); Seung Wook Nam, Cheonan-si (KR); Yong Cheol Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 315 days.

(21) Appl. No.: 14/735,018

(22) Filed: Jun. 9, 2015

(65) Prior Publication Data

US 2016/0014881 A1   Jan. 14, 2016

(30) Foreign Application Priority Data

Jul. 8, 2014  (KR) .................. 10-2014-0085013
Apr. 24, 2015 (KR) .................. 10-2015-0058165

(51) Int. Cl.
*H05K 1/02* (2006.01)
*G06F 1/16* (2006.01)
*G09F 9/30* (2006.01)
*H05K 5/00* (2006.01)

(52) U.S. Cl.
CPC .......... *G06F 1/1652* (2013.01); *G06F 1/1616* (2013.01); *G09F 9/301* (2013.01); *H05K 1/02* (2013.01); *H05K 5/00* (2013.01); *Y10T 428/10* (2015.01); *Y10T 428/1036* (2015.01)

(58) Field of Classification Search
CPC .................. G06F 3/041; G06F 3/0412; G06F 2203/04102; Y10T 428/10; Y10T 428/1036; H05K 1/02; H05K 5/00
See application file for complete search history.

(56) References Cited

U.S. PATENT DOCUMENTS

| | | | |
|---|---|---|---|
| 2008/0247191 A1* | 10/2008 | Hsu | G02B 3/0043 362/612 |
| 2011/0287233 A1* | 11/2011 | Ma | B32B 27/08 428/195.1 |
| 2012/0307423 A1 | 12/2012 | Bohn et al. | |
| 2013/0034685 A1 | 2/2013 | An et al. | |
| 2013/0169515 A1* | 7/2013 | Prushinskiy | G06F 1/1652 345/55 |
| 2014/0029212 A1* | 1/2014 | Hwang | G09F 9/33 361/749 |
| 2014/0034365 A1 | 2/2014 | Otsubo | |
| 2014/0183473 A1* | 7/2014 | Lee | H01L 51/0097 257/40 |

FOREIGN PATENT DOCUMENTS

KR   10-2009-0129168 A   12/2009

* cited by examiner

*Primary Examiner* — Anthony J Frost
(74) *Attorney, Agent, or Firm* — Lewis Roca Rothgerber Christie LLP

(57) ABSTRACT

A foldable display device includes: a display panel having a folded portion bendable along a fold line; and a cover window disposed on the display panel, wherein the cover window includes: at least a soft pattern disposed on the folded portion of the display panel; and a hard coating layer disposed on the display panel having the soft pattern formed thereon, and the soft pattern has a triangular cross section.

13 Claims, 7 Drawing Sheets

FOLDABLE DISPLAY DEVICE

CROSS-REFERENCE TO RELATED APPLICATION

This application claims priority to and the benefit of Korean Patent Application No. 10-2014-0085013, filed on Jul. 8, 2014, and Korean Patent Application No. 10-2015-0058165, filed on Apr. 24, 2015, with the Korean Intellectual Property Office, the disclosure of which are incorporated herein in their entirety by reference.

BACKGROUND

1. Field

Embodiments of the present invention relate to a foldable display device, and more particularly, to a foldable display device enhanced in flexibility thereof.

2. Description of the Related Art

In recent times, the field of foldable display devices is undergoing significant development. Such flexible display devices exhibit versatility thereof in various fields of application due to the capability of being used when folded or curved. A flexible display device is provided by a display element being disposed on a flexible substrate.

Examples of such a display element applicable to a flexible display device include an organic light emitting diode (OLED) element, a liquid crystal display (LCD) element, an electrophoretic display (EPD) element, and the like. Among these, an OLED element is considered to be appropriate for a display element of a flexible display device due to having excellent flexibility given that an OLED element is manufactured in a stacked structure having a thin film shape.

Flexible display devices are classified into types thereof including a rollable display device capable of being rolled into a scroll shape based on bendability thereof, a foldable display device capable of being folded like a paper, and a stretchable display device capable of being elongated and compressed, and the like.

In particular, a foldable display device is garnering attention as a next generation display device due to the ease of portability when a screen thereof is folded and the ability to achieve a relatively large display area on the screen when unfolded.

Meanwhile, a foldable display device may include a display panel and a cover window disposed on the display panel. The cover window may include a hard coating layer having a hardness exceeding a predetermined level thereof. Although such a hard coating layer is advantageous for protecting the display panel, issues may arise when a hard coating layer is used in a display device having a bendable property such as a foldable display device due to the potential brittleness of a hard coating layer under a bending force.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Aspects of embodiments of the present invention are directed to a foldable display device including a cover window having excellent flexibility without the reduction in a hardness thereof.

According to an exemplary embodiment of the present invention, a foldable display device includes: a display panel having a folded portion bendable along a fold line; and a cover window disposed on the display panel, wherein the cover window includes: at least a soft pattern disposed on the folded portion of the display panel; and a hard coating layer disposed on the display panel having the soft pattern formed thereon, and the soft pattern has a triangular cross section.

The soft pattern may be disposed to be parallel with respect to the fold line.

The soft pattern may have a hardness lower than a hardness of the hard coating layer.

The soft pattern may have a hardness of about 2 hardness (H) or lower.

The hard coating layer may have a hardness of higher than or equal to about 2H.

The soft pattern may have a width decreased as farther away from the display panel.

The cover window may include a plurality of soft patterns spaced apart from one another at an interval in a range of about 10 micrometers (µm) to about 100 µm.

The hard coating layer may be disposed between the soft patterns.

The hard coating layer may have a thickness in a range of about 10 µm to about 100 µm.

The hard coating layer may be disposed to cover the soft pattern.

The soft pattern may include a polymer resin.

The hard coating layer may include one of glass and a high-hardness resin film.

The foregoing is illustrative only and is not intended to be in any way limiting.

In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of invention will be more clearly understood from the following detailed description taken in conjunction with the accompanying drawings, in which.

DETAILED DESCRIPTION

Hereinafter, embodiments of the present invention will now be described in more detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first", "second", and the like, may be used herein to describe various elements, components, areas, layers and/or sections, these elements, components, areas, layers and/or sections should not be limited by these terms. These terms are only used to distinguish one element, component, area, layer or section from another element, component, area, layer or section. Thus, a first element, component, area, layer or section discussed below could be termed a second element, component, area, layer or section without departing from the teachings of example embodiments.

Constituent elements, operations and techniques which are irrelevant to the description of the present invention are not described in detail in the embodiments in order to prevent the present invention from being obscurely interpreted. Like reference numerals refer to like elements throughout the specification.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Figure 1:
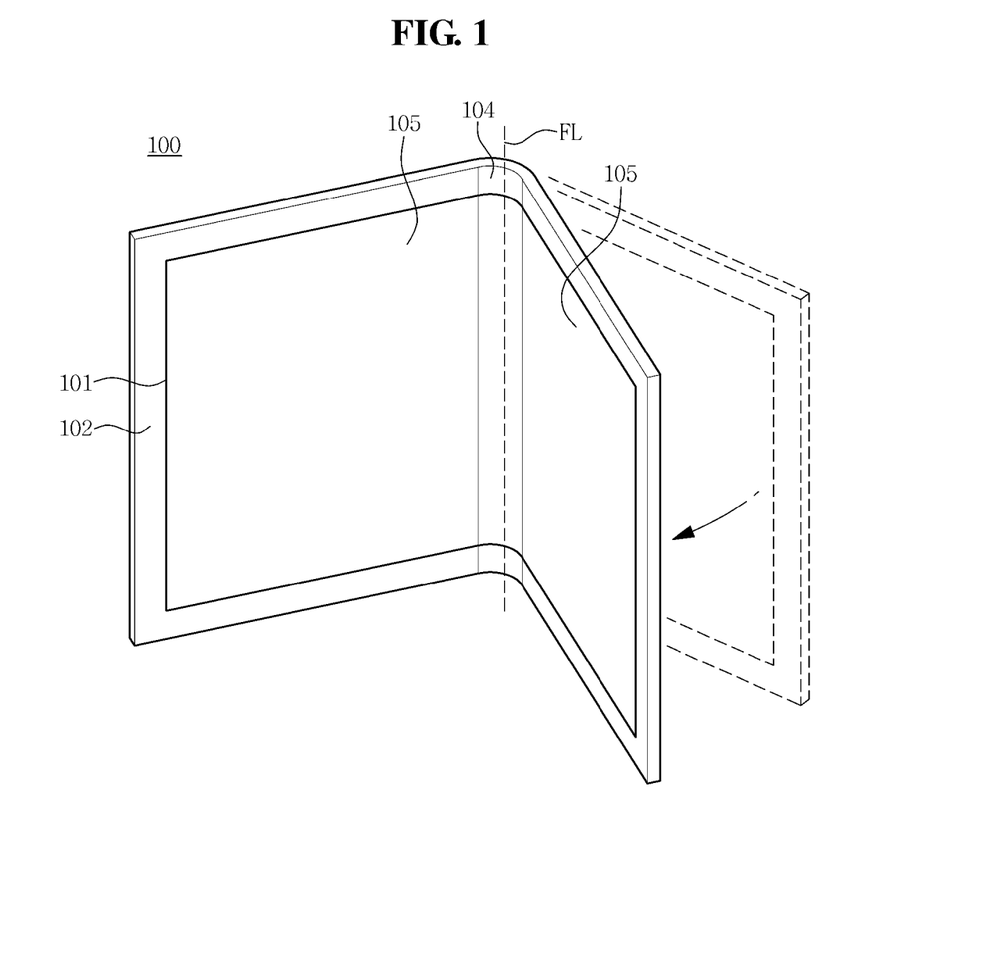
FIG. 1 is a perspective view illustrating a foldable display device according to an exemplary embodiment of the present invention.
Figure 2:
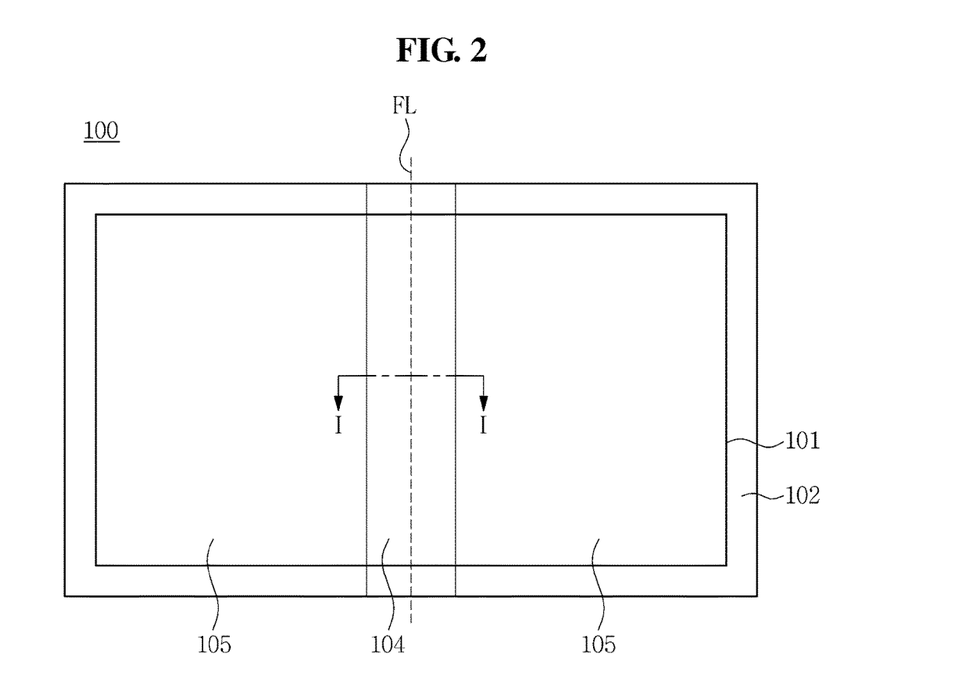
FIG. 2 is a plan view illustrating a foldable display device according to an exemplary embodiment of the present invention.

FIG. 1 is a perspective view illustrating a foldable display device according to an exemplary embodiment of the present invention; and FIG. 2 is a plan view illustrating a foldable display device according to an exemplary embodiment of the present invention.

Referring to FIGS. 1 and 2, a foldable display device 100 according to an exemplary embodiment may include a display portion 101 displaying an image and a non-display portion 102 around the display portion 101, and may be foldable along a fold line FL. The fold line FL may not be an actual component of the foldable display device 100, but rather a virtual line used for ease of description.

Although FIGS. 1 and 2 illustrate the foldable display device 100 as being folded in a left-right symmetrical manner along the fold line FL, the folding manner of the foldable display device 100 is not limited thereto, and the foldable display device 100 may be folded in a left-right asymmetrical manner. Further, a foldable display device according to another exemplary embodiment may include two or more fold lines FL.

In addition, the foldable display device 100 may include a folded portion 104 which is bendable along the fold line FL and a flat portion 105 which is unbent.

Figure 3:
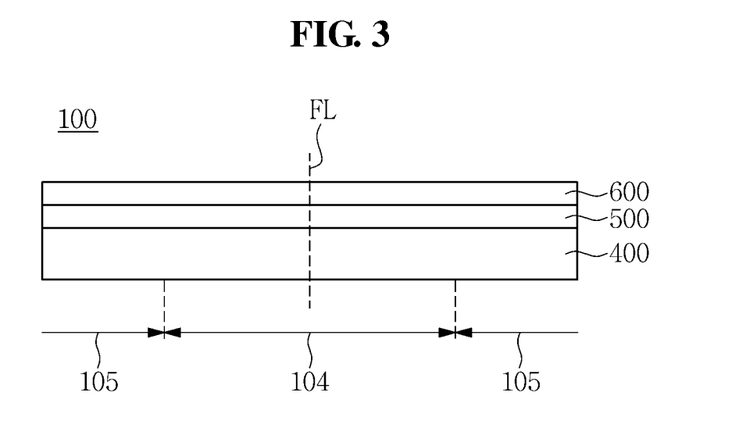
FIG. 3 is a cross-sectional view taken along line I-I of FIG. 2.
Figure 4:
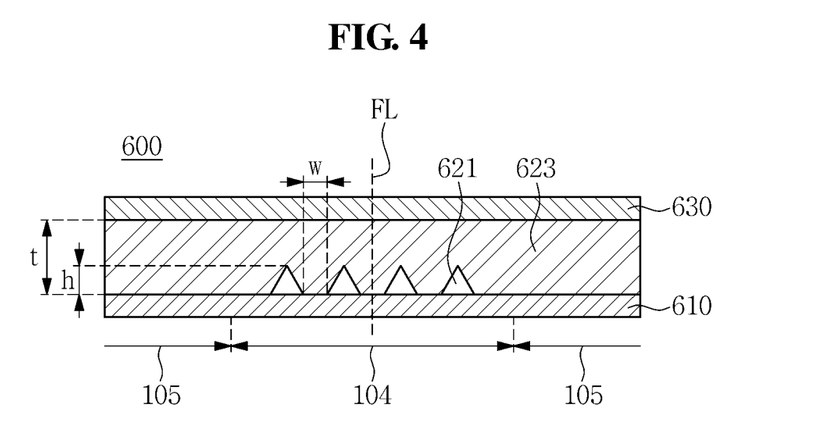
FIG. 4 is a schematic cross-sectional view illustrating a cover window illustrated in FIG. 3.
Figure 5:
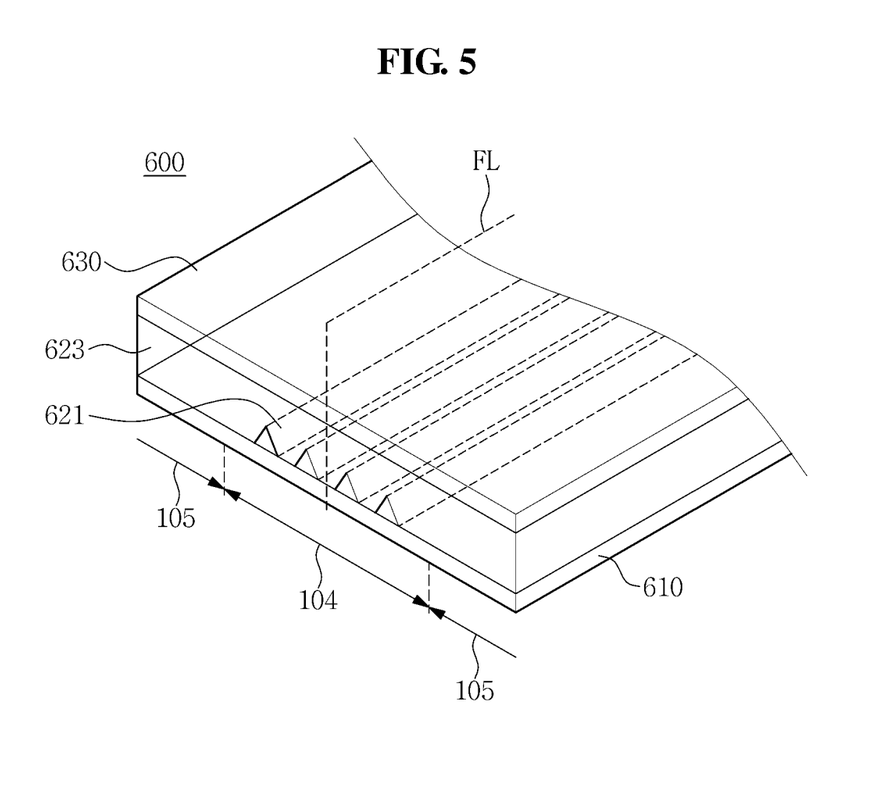
FIG. 5 is a schematic perspective view illustrating the cover window illustrated in FIG. 3.

FIG. 3 is a cross-sectional view taken along line I-I of FIG. 2; FIG. 4 is a schematic cross-sectional view illustrating a cover window illustrated in FIG. 3; and FIG. 5 is a schematic perspective view illustrating the cover window illustrated in FIG. 3.

Referring to FIG. 3, the foldable display device 100 according to the exemplary embodiment may include a display panel 400, a touch panel 500 on the display panel 400, and a cover window 600 on the touch panel 500.

The display panel 400, the touch panel 500, and the cover window 600 may each have the folded portion 104 which is bendable along the fold line FL and the flat portion 105 which is unbent.

The display panel 400 may display an image. The display panel 400 is not particularly limited, and may include various display panels such as an organic light emitting diode (OLED) display panel, a liquid crystal display (LCD) panel, a plasma display panel (PDP), and an electrophoretic display (EPD) panel.

The touch panel 500 may be disposed between the display panel 400 and the cover window 600 to receive a touch signal supplied thereto externally of the cover window 600. The touch panel 500 may convert the touch signal into an electrical signal to supply the converted signal to the display panel 400.

With regard to the configuration of the foldable display device 100 according to the exemplary embodiment, a detailed description pertaining to the display panel 400 will be provided further. Hereinafter, a detailed description pertaining to the cover window 600 according to the exemplary embodiment will be provided with reference to FIGS. 4 and 5.

Referring to FIGS. 4 and 5, the cover window 600 according to the exemplary embodiment may include a film base 610, at least a soft pattern 621 disposed on a portion of the film base 610 corresponding to the folded portion 104, a hard coating layer 623 disposed on the entirety of the film base 610 having the soft pattern 621 formed thereon, and a functional coating layer 630 disposed on the hard coating layer 623.

The film base 610, the hard coating later 623, and the functional coating layer 630 constituting the cover window 600 may each have the folded portion 104 which is bendable along the fold line FL and the flat portion 105 which is unbent.

The film base 610 may be selected from films including transparent materials known in the art, as necessary, and is not particularly limited. Examples of such transparent films may include a polyester film, a polyethylene film, a polypropylene film, a triacetyl cellulose film, a polyvinyl chloride film, a polyvinyl alcohol film, a polyimide film, a cycloolefin resin film, a polycarbonate (PC) film, a polyethylene terephthalate (PET) film, a polyethylene naphthalate (PEN) film, a polyether sulphone (PES) film, an epoxy resin film, a phenolic resin film, a melamine resin film, a polyurethane film, and an acrylic resin film.

The soft pattern 621 may be disposed on the portion of the film base 610 corresponding to the folded portion 104. The soft pattern 621 may have a bar shape extending in a direction parallel with respect to the fold line FL, and may have a triangular cross section such that a width of the soft pattern 621 is decreased as farther away from the display panel 400. That is, the soft pattern 621 may have a prism shape, which has a triangular cross section.

The hard coating layer 623 may be disposed on the entirety of the film base 610 having the soft pattern 621 formed thereon. The hard coating layer 623 may have a thickness "t" greater than a height "h" of the soft pattern 621 at a highest point of the soft pattern 621 to thereby cover the soft pattern 621. The hard coating layer 623 may have a thickness "t" in a range of about 10 µm to about 100 µm.

The soft pattern 621 may have a hardness lower than that of the hard coating layer 623. In detail, the soft pattern 621 may have a pencil hardness of about 2 hardness (H) or lower, and the hard coating layer 623 may have a pencil hardness of higher than or equal to about 2H.

The soft pattern 621 may include a polymer resin, and more particularly, at least one selected from the group consisting of an acrylic resin, an acrylic urethane resin, a polyester acrylate resin, a polyurethane acrylate resin, an epoxy acrylate resin, an urethane resin, an epoxy resin, a silicon resin, and a combination thereof. The hard coating layer 623 may include a material having a hardness higher than that of the soft pattern 621, such as glass or a high-hardness film.

In this regard, the soft pattern 621 and the hard coating layer 623 may be formed using materials having different hardnesses, or may be formed to have different hardnesses by varying a hardness of the same material.

In addition, the soft patterns 621 may be disposed to be spaced apart from one another to have a predetermined interval "w" therebetween. For example, the soft pattern 621 may have an interval "w" in a range of about 10 µm to about 100 µm. Consequently, the hard coating layer 623 may be disposed between the soft patterns 621. That is, the soft pattern 621 having a first hardness and the hard coating layer 623 having a second hardness higher than the first hardness may be disposed in an alternating manner.

Further, the soft pattern 621 may have a refractive index the same as that of the hard coating layer 623 to ensure an index matching between the soft pattern 621 and the hard coating layer 623. When the index matching is realized therebetween, transmissivity and visibility of the cover window 600 may be enhanced. The coating layer 623 may be formed while filling the interval "w" between the soft patterns 621.

The functional coating layer 630 may be a layer for assigning various functions to the cover window 600, and may include, for example, an anti-finger (AF) coating layer resisting stains such as fingerprints of a user, an anti-reflection (AR) coating layer preventing external light from being reflected to a user, or an anti-glare (AG) coating layer.

Figure 6:
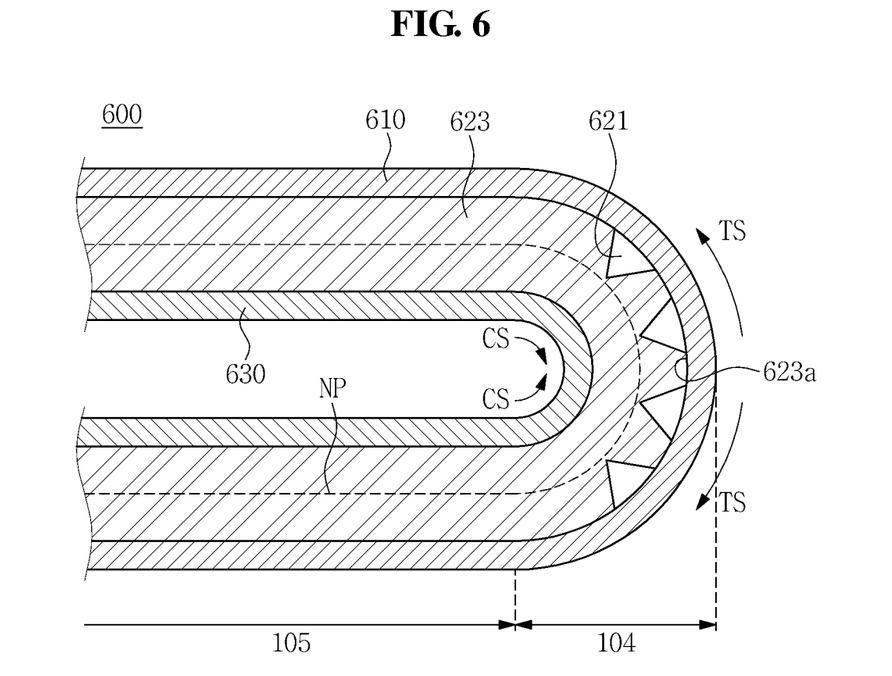
FIG. 6 is a schematic cross-sectional view illustrating a cover window according to an exemplary embodiment of the present invention in a folded state.

FIG. 6 is a schematic cross-sectional view illustrating a cover window according to an exemplary embodiment of the present invention in a folded state. In detail, FIG. 6 is a cross-sectional view illustrating various stresses applied to the cover window 600 according to the exemplary embodiment at the time of the cover window 600 being folded.

The term "stress" may refer to resistance or deformability of a material arising therein when applied by external forces. Although a stress may be indefinitely increased in response to an increase in external forces, a material has a limit in withstanding such a stress. Therefore, when reaching a point of a yield stress, that is, a unique property, of a material, the material may experience a fracture. Accordingly, as the yield stress of the material is increased, a rigidity thereof may also be increased. A level of stress may be expressed by a magnitude of external forces applied per unit area, which is termed as a unit stress. Hereinafter, unless otherwise indicated, the term "stress" may refer to a unit stress.

When the folded portion 104 of the cover window 600 is folded, different bending stresses BS may occur in the folded portion 104 of the cover window 600. For example, a tensile stress TS may occur on one surface of the cover window 600 and a compressive stress CS may occur on another surface of the cover window 600 based on a neutral plane NP.

As used herein, the neutral plane NP may refer to a surface of a material of which an original length is maintained without being compressed or elongated when a bending force is applied thereto. A position of the neutral plane NP may be determined by a thickness, an elastic coefficient, and the like, of each layer constituting the cover window 600.

In a case of a conventional cover window, when a stress is iteratively applied to the folded portion or a bending stress BS beyond a point of a fracture strength is applied thereto, the hard coating layer having a relativley low flexibility may exeperience brittleness therein. In particular, the hard coating layer of the conventional cover window is vulnerable to a tensile stress TS.

In the cover window 600 according to the exemplary embodiment, the soft pattern 621 having the hardness lower than that of the hard coating layer 623 may be provided in the folded portion 104 of the hard coating layer 623, such that a tensile stress TS applied to the hard coating layer 623 may be reduced.

The tensile stress TS applied to the hard coating layer 623 may be at maximum on a first surface 623a of the hard coating layer 623 on which the film base 610 is in contact therewith, and due to the soft pattern 621 formed on the first surface 623a of the hard coating layer 623, the tensile stress TS applied to the hard coating layer 623 may be reduced. In addition, as the width of the soft pattern 621 is decreased as farther away from the first surface 623a of the hard coating layer 623, the reduction in the hardness of the hard coating layer 623 may be minimized.

Accordingly, in the cover window 600 according to the exemplary embodiment, at least one of the soft patterns 621 having the triangular cross section and the hardness lower than that of the hard coating layer 623 may be disposed on the folded portion 104, such that the tensile stress TS applied to the hard coating layer 623 may be significantly reduced and the reduction in the hardness of the hard coating layer 623 may be minimized.

Figure 7:
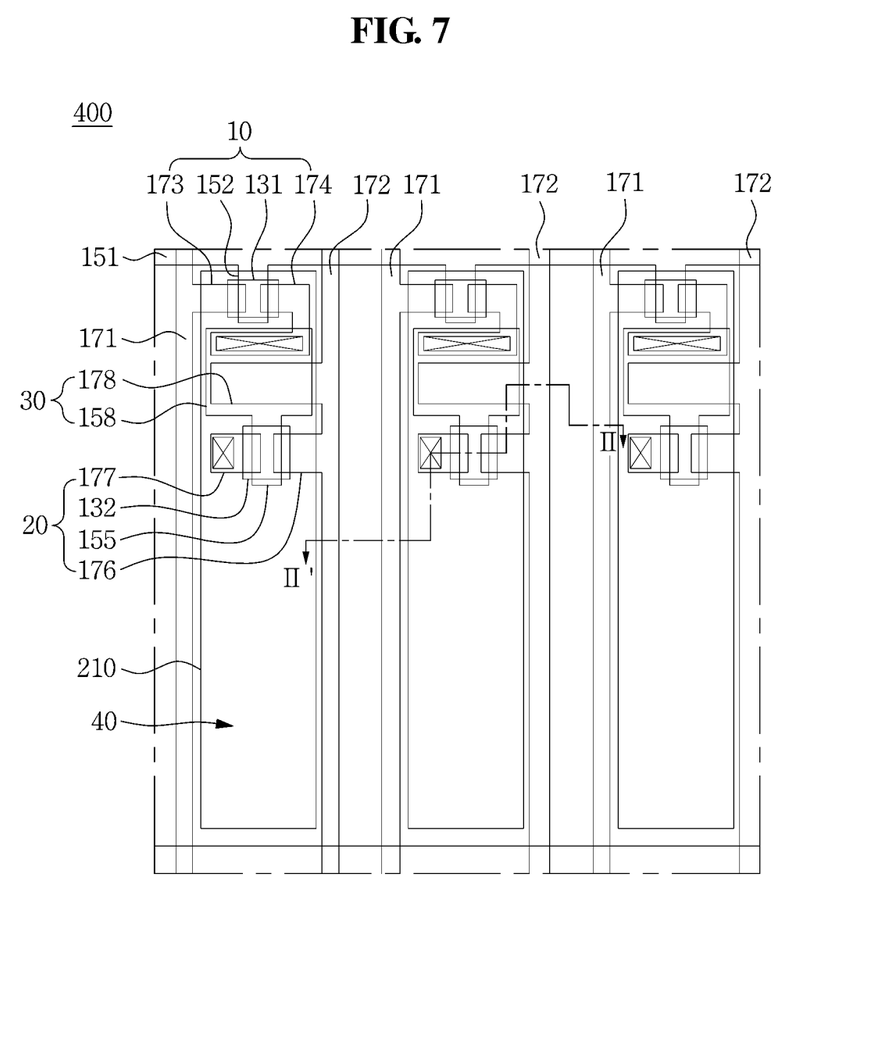
FIG. 7 is an enlarged view illustrating a portion of a display panel according to an exemplary embodiment of the present invention.
Figure 8:
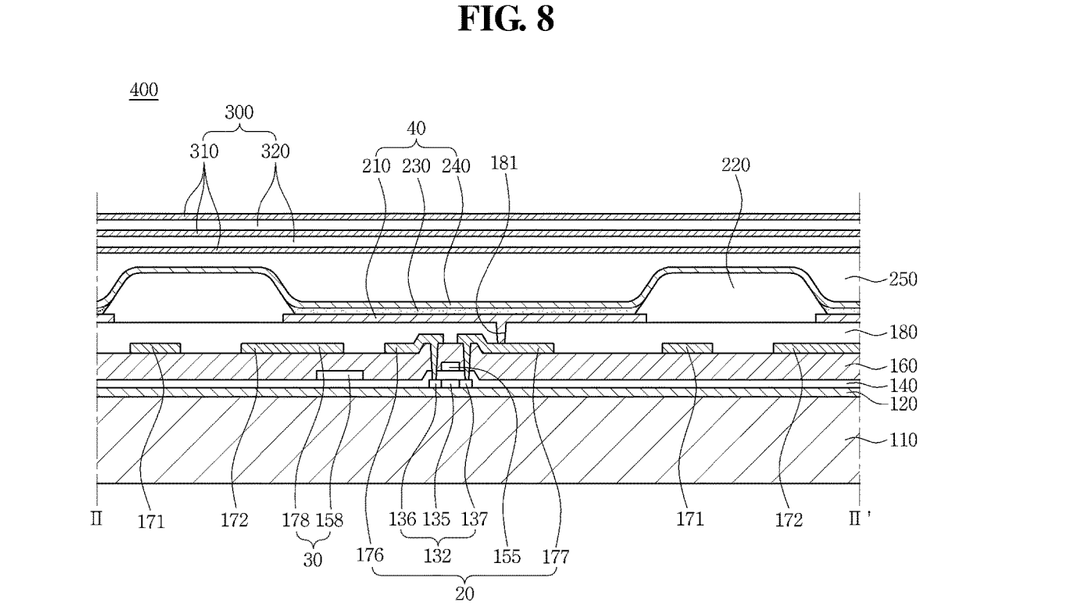
FIG. 8 is a cross-sectional view taken along line II-II' of FIG. 7.

FIG. 7 is an enlarged view illustrating a portion of a display panel according to an exemplary embodiment of the present invention; and FIG. 8 is a cross-sectional view taken along line II-II' of FIG. 7.

Referring to FIGS. 7 and 8, the display panel 400 according to the exemplary embodiment may include a switching thin film transistor (TFT) 10, a driving TFT 20, a power storage element 30, and an OLED element 40, which are disposed on a flexible substrate 110.

The flexible substrate 110 may include at least one selected from Kapton, polyethersulphone (PES), polycarbonate (PC), polyimide (PI), polyethyleneterephthalate (PET), polyethylenenaphthalate (PEN), polyacrylate (PAR), and fiber reinforced plastic (FRP). In particular, PI, having high thermal resistivity, may be suitable for a material forming the flexible substrate 110, which is subject to high-temperature processes.

The flexible substrate 110 may have a thickness of from about 5 µm to about 200 µm. In a case in which the flexible substrate 110 has a thickness less than 5 µm, for example, the flexible substrate 110 may not stably support a driving circuit 120 and a display element 130. On the other hand, in a case in which the flexible substrate 110 has a thickness greater than or equal to 200 µm, for example, flexibility thereof may be reduced. In addition, the flexible substrate 110 may have a coefficient of expansion (CTE) of from about 3 parts per million (ppm)/° C. to about 10 ppm/° C.

The flexible substrate 110 may include a buffer layer 120 disposed thereon. The buffer layer 120 may serve to prevent infiltration of impure elements to the flexible substrate 110 and planarize a surface of the flexible substrate 110, and may be formed of various materials capable of performing the aforementioned functions. For example, the buffer layer 120 may include at least one selected from the group consisting of silicon nitride ($SiN_x$), silicon oxide ($SiO_2$), and silicon oxynitride ($SiO_xN_y$). The buffer layer 120 is not necessarily required, and thus may be omitted based on the type, the process conditions, and the like, of the flexible substrate 110.

A switching semiconductor layer 131 and a driving semiconductor layer 132 may be disposed on the buffer layer 120. The switching semiconductor layer 131 and the driving semiconductor layer 132 may be formed using one of a polycrystalline silicon layer, an amorphous silicon layer, an oxide semiconductor such as indium-gallium-zinc oxide (IGZO) and indium-zinc-tin oxide (IZTO). For example, in the case in which the driving semiconductor layer 132 illustrated in FIG. 8 is formed of a polycrystalline silicon layer, the driving semiconductor layer 132 may include a channel region 135 undoped with impurities, and a source region 136 and a drain region 137 doped with p-type impurities at both sides of the channel region 135, respectively. In this instance, ion materials used for doping may be p-type impurities such as boron (B), and in particular, diborane ($B_2H_6$) may be used. Such impurities may differ based on the type of the TFT. Although a p-type metal-oxide semiconductor (PMOS) TFT using p-type impurities is used as the driving TFT 20 in the exemplary embodiment, the type of the driving TFT 20 is not limited thereto. Accordingly, the driving TFT 20 may also use an n-type metal-oxide semiconductor (NMOS) TFT or a complementary metal-oxide semiconductor (CMOS) TFT.

A gate insulating layer 140 may be disposed on the switching semiconductor layer 131 and the driving semiconductor layer 132. The gate insulating layer 140 may include at least one of tetraethyl orthosilicate (TEOS), $SiN_x$, and $SiO_2$. For example, the gate insulating layer 140 may have a double-layer structure in which a $SiN_x$ layer having a thickness of about 40 nanometers (nm) and a TEOS layer having a thickness of about 80 nm are sequentially stacked.

The gate insulating layer 140 may include a gate wiring disposed thereon, the gate wiring including gate electrodes 152 and 155. The gate wiring may further include a gate line 151, a first power storage plate 158, and another wiring. The gate electrodes 152 and 155 may be disposed to overlap at least portions of the switching semiconductor layer 131 and the driving semiconductor layer 132, in particular, the channel region 135. The gate electrodes 152 and 155 may serve to block impurities from being doped in the channel region 135 at the time of the impurities being doped in the source region 136 and the drain region 137 of the switching semiconductor layer 131 and the driving semiconductor layer 132 during the formation of the switching semiconductor layer 131 and the driving semiconductor layer 132.

The gate electrodes 152 and 155 and the first power storage plate 158 may be disposed on the same layer, and may be formed of substantially the same metal. The gate electrodes 152 and 155 and the first power storage plate 158 may include at least one of molybdenum (Mo), chromium (Cr), and tungsten (W).

An insulating interlayer 160 may be disposed on the gate insulating layer 140, the insulating interlayer 160 covering the gate electrodes 152 and 155. The insulating interlayer 160 may be formed of $SiN_x$, $SiO_x$, TEOS, or the like, in a manner similar to that of the gate insulating layer 140; however, the material forming the insulating interlayer 160 is not limited thereto.

The insulating interlayer 160 may include a data wiring disposed thereon, the data wiring including source electrodes 173 and 176 and drain electrodes 174 and 177. The data wiring may further include a data line 171, a common power line 172, a second power storage plate 178, and another wiring. The source electrodes 173 and 176 may be connected to the source region 136 of the switching semiconductor layer 131 and the driving semiconductor layer 132 and the drain electrodes 174 and 177 may be connected to the drain region 137 of the switching semiconductor layer 131 and the driving semiconductor layer 132, through contact holes formed in the gate insulating layer 140 and the insulating interlayer 160.

A planarization layer 180 may be formed to cover the data line 171, the common power line 172, the source electrodes 173 and 176, the drain electrodes 174 and 177, and the second power storage plate 178, which are disposed on the insulating interlayer 160. The planarization layer 180 may serve to remove a step difference in the elements disposed on the insulating interlayer 160 and may planarize the elements disposed on the insulating interlayer 160 in order to enhance light emission efficiency of the OLED element 40 to be formed on the planarization layer 180. The planarization layer 180 may be formed of at least one of a polyacrylate resin, an epoxy resin, a phenolic resin, a polyamide resin, a polyimide resin, an unsaturated polyester resin, a polyphenylenether resin, a polyphenylenesulfide resin, and benzocyclobutene (BCB).

Accordingly, the switching TFT 10 may include the switching semiconductor layer 131, the gate electrode 152, for example, a switching gate electrode, the source electrode 173, for example, a switching source electrode, and the drain electrode 174, for example, a switching drain electrode; the driving TFT 20 may include the driving semiconductor layer 132, the gate electrode 155, for example, a driving gate electrode, the source electrode 176, for example, a driving source electrode, and the drain electrode 177, for example, a driving drain electrode. The configuration of the switching TFT 10 and the driving TFT 20 is not limited to the aforementioned description, and may be modified in various manners to include the configuration of the TFT known in the art easily applicable by those skilled in the art. In addition, the power storage element 30 may include the first power storage plate 158 and the second power storage plate 178 which are disposed to have the insulating interlayer 160 therebetween. In this case, the insulating interlayer 160 may be a dielectric material, and power storage capacity may be determined by an amount of electric charges accumulated in the power storage element 30 and a level of a voltage between the first and second power storage plates 158 and 178.

The switching TFT 10 may be used as a switching element selecting a pixel to emit light. The switching gate electrode 152 may be connected to the gate line 151. The switching source electrode 173 may be connected to the date line 171. The switching drain electrode 174 may be disposed to be spaced apart from the switching source electrode 173 and may be connected to the first power storage plate 158.

The driving TFT 20 may apply driving power for emitting the OLED element 40 within the selected pixel to a pixel electrode 210 of the OLED element 40. The driving gate electrode 155 may be connected to the first power storage plate 158. The driving source electrode 176 and the second power storage plate 178 may be connected to the common power line 172. The driving drain electrode 177 may be connected to the pixel electrode 210 through a contact hole.

Due to the configuration of the TFTs as described above, the switching TFT 10 may be operated by a gate voltage applied to the gate line 151 to thereby transfer a data voltage applied to the data line 171 to the driving TFT 20. A voltage having a level equal to a difference between a level of a common voltage applied from the common power line 172 to the driving TFT 20 and a level of the data voltage transferred from the switching TFT 10 may be stored in the power storage element 30, and a current having a level equal to the level of the voltage stored in the power storage element 30 may flow into the OLED element 40 through the driving TFT 20, and thereby the OLED element 40 may emit light.

The OLED element 40 may include the pixel electrode 210, a light emitting layer 230 disposed on the pixel electrode 210, and a common electrode 240 formed on the light emitting layer 230. At least a pixel electrode 210 may be disposed in each pixel region.

The pixel electrode 210 of the OLED element 40 may be disposed on the planarization layer 180. The pixel electrode 210 may be connected to the drain electrode 177 through a contact hole 181 formed in the planarization layer 180.

A pixel defining layer 220 defining the pixel region by exposing at least a portion of the pixel electrode 210 may be disposed on the planarization layer 180. The pixel defining layer 220 may be formed of a resin such as a polyacrylate resin or a polyimide resin.

The light emitting layer 230 may be disposed on the pixel electrode 210 within the pixel region, and the common electrode 240 may be disposed on the pixel defining layer 220 and the light emitting layer 230. The light emitting layer 230 may be formed of a low molecular weight organic material or a polymer organic material. At least one of a hole injection layer (HIL) and a hole transporting layer (HTL) may further be disposed between the pixel electrode 210 and the light emitting layer 230, and at least one of an electron transporting layer (ETL) and an electron injection layer (EIL) may further be disposed between the light emitting layer 230 and the common electrode 240.

The pixel electrode 210 and the common electrode 240 may be formed using one of a transmissive electrode, a transflective electrode, and a reflective electrode.

The transmissive electrode may be formed of transparent conductive oxide (TCO). Such TCO may include at least one selected from the group consisting of indium-tin oxide (ITO), indium-zinc oxide (IZO), antimony-tin oxide (ATO), aluminum-zinc oxide (AZO), zinc oxide (ZnO), and a compound thereof.

The transflective and reflective electrodes may be formed of a metal such as magnesium (Mg), silver (Ag), gold (Au), calcium (Ca), lithium (Li), Cr, aluminum (Al), or copper (Cu), or an alloy thereof. Here, the type of electrode, for example, the transflective electrode and the reflective electrode, may be determined by a thickness thereof. In general, the transflective electrode may have a thickness of about 200 nm or less, and the reflective electrode may have a thickness of about 300 nm or more. As the thickness of the transflective electrode is reduced, light transmissivity thereof may be increased while resistance thereof may be increased, and as the thickness thereof is increased, light transmissivity thereof may be reduced.

In addition, the transflective and reflective electrodes may have a multilayer structure including a metal layer formed of a metal or a metal alloy and a TCO layer stacked on the metal layer.

A capping layer 250 may be disposed on the common electrode 240 in order to protect the OLED element 40 prior to forming a thin film encapsulation layer 300 and prevent the OLED element 40 from being damaged during the formation of the thin film encapsulation layer 300. The capping layer 250 may be formed of a single layer or two or more layers, and may have a moisture or oxygen barrier property. Alternatively, the capping layer 250 may be omitted, and an organic layer 320 of the thin film encapsulation layer 300 may be disposed in lieu of the capping layer 250.

The thin film encapsulation layer 300 may be formed on the capping layer 250. The thin film encapsulation layer 300 may include at least an inorganic layer 310 and at least an organic layer 320. In addition, the thin film encapsulation layer 300 may have a structure in which the inorganic layer 310 and the organic layer 320 are alternately stacked. In this case, the inorganic layer 310 may be disposed in a lowermost portion of the thin film encapsulation layer 300. The thin film encapsulation layer 300 may have a thickness of about 10 μm or less. The number of the inorganic layers 310 and the organic layers 320 is not limited to the example illustrated in FIG. 8.

The inorganic layer 310 may include at least one of aluminum oxide or silicon oxide. The organic layer 320 may include at least one of epoxy, acrylate, and urethane acrylate. The inorganic layer 310 may serve to suppress infiltration of moisture and oxygen toward the flexible display panel 100, and the organic layer 320 may serve to alleviate stress within the inorganic layer 310 and fill a minute crack, a pin hole, and the like, of the inorganic layer 310.

As set forth above, according to exemplary embodiments of the present invention, in the cover window, at least one of the soft patterns having the triangular cross section and a relatively low hardness than that of the hard coating layer may be disposed on the folded portion, such that the tensile stress applied to the hard coating layer may be significantly reduced and the reduction in the hardness of the hard coating layer may be minimized.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the invention.

What is claimed is:

1. A foldable display device comprising:
   a display panel having a folded portion bendable along a fold line;
   a cover window disposed on the display panel,
   wherein the cover window includes:
   a film base;
   at least a soft pattern disposed on the film base; and
   a hard coating layer disposed on the film base having the soft pattern formed thereon,
   wherein the soft pattern has a triangular cross section having a width that decreases with distance from the display panel toward a surface of the cover window opposite the film base, and wherein a base of the soft pattern directly contacts the film base,
   wherein the soft pattern has a height that is less than a thickness from a first surface of the hard coating layer to a neutral plane of the hard coating layer, and wherein the first surface of the hard coating layer contacts the base film.

2. The foldable display device of claim 1, wherein the soft pattern is disposed to be parallel with respect to the fold line.

3. The foldable display device of claim 1, wherein the soft pattern has a hardness lower than a hardness of the hard coating layer.

4. The foldable display device of claim 1, wherein the cover window includes a plurality of soft patterns spaced apart from one another at an interval in a range of about 10 micrometers (pm) to about 100 um.

5. The foldable display device of claim 4, wherein the hard coating layer has a thickness in a range of about 10 μm to about 100 gm.

6. The foldable display device of claim 1, wherein the hard coating layer is disposed to cover the soft pattern.

7. The foldable display device of claim 1, wherein the soft pattern includes a polymer resin.

8. The foldable display device of claim 1, wherein the hard coating layer includes one of glass and a high-hardness resin film.

9. The foldable display device of claim 1, further comprising a touch panel disposed between the display panel and cover window.

10. The foldable display device of claim 9, wherein the width of the triangular cross section decreases as it extends away from the touch panel.

11. The foldable display device of claim 3, wherein the soft pattern has a hardness of about 2 hardness (H) or lower.

12. The foldable display device of claim 3, wherein the hard coating layer has a hardness of higher than or equal to about 2H.

13. The foldable display device of claim 1, further comprising:
a touch panel disposed between the display panel and the cover window, wherein the soft pattern has a triangular cross section having a width decreasing in a direction extending away from the touch panel.

* * * * *